(12) United States Patent
Chen et al.

(10) Patent No.: US 7,245,529 B2
(45) Date of Patent: Jul. 17, 2007

(54) DYNAMICALLY TUNABLE RESISTOR OR CAPACITOR USING A NON-VOLATILE FLOATING GATE MEMORY CELL

(75) Inventors: Bomy Chen, Cupertino, CA (US); Kevin Gene-Wah Jew, Fremont, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 320 days.

(21) Appl. No.: 11/092,227

(22) Filed: Mar. 28, 2005

(65) Prior Publication Data

US 2006/0220149 A1 Oct. 5, 2006

(51) Int. Cl.
*G11C 11/34* (2006.01)

(52) U.S. Cl. .................. 365/185.05; 365/148; 365/149; 365/189.07; 365/211

(58) Field of Classification Search ........... 365/185.05, 365/148, 149, 189.07, 211
See application file for complete search history.

(56) References Cited

U.S. PATENT DOCUMENTS

| | | | |
|---|---|---|---|
| 5,029,130 A | | 7/1991 | Yeh |
| 5,602,779 A | * | 2/1997 | Gotou .................... 365/185.23 |
| 5,936,880 A | * | 8/1999 | Payne ........................ 365/148 |
| 6,795,350 B2 | * | 9/2004 | Chen et al. ............ 365/189.07 |
| 6,888,773 B2 | * | 5/2005 | Morimoto .................... 365/218 |
| 7,072,236 B2 | * | 7/2006 | Matsuoka ................... 365/207 |

* cited by examiner

*Primary Examiner*—Tuan T. Nguyen
(74) *Attorney, Agent, or Firm*—DLA Piper US LLP

(57) ABSTRACT

An integrated circuit programmable resistor or programmable capacitor has a floating gate memory cell connected either in series or in parallel to a fixed resistor or a fixed capacitor. The resistance or the capacitance of the floating gate memory cell can be changed by the amount of charge stored on the floating gate which affects the resistance or the capacitance of the channel from which the floating gate is spaced apart. A particular application of the programmable resistor/capacitor is used in a system whereby the resistance or the capacitance can be change or fine tuned as a result of either drift caused by time or by operating conditions such as temperature. Thus, the temperature of the substrate in which the floating gate memory cell is fabricated can be monitored and the resistance or the capacitance of the floating gate memory cell changed dynamically.

18 Claims, 4 Drawing Sheets

DYNAMICALLY TUNABLE RESISTOR OR CAPACITOR USING A NON-VOLATILE FLOATING GATE MEMORY CELL

TECHNICAL FIELD

The present invention relates to a dynamically tunable resistor or capacitor using a non-volatile memory cell, and more particularly to a non-volatile memory cell of the floating gate type wherein the floating gate is spaced apart from a channel region and charges on the floating gate controls the resistance or capacitance of the channel region.

BACKGROUND OF THE INVENTION

Nonvolatile memory cells such as those of the floating gate type are well known in the art. In a floating gate non-volatile memory cell, the cell is constructed from a semiconductor substrate of a first conductivity type. The substrate has a first and a second region of a second conductivity type spaced apart from one another with a channel region there between. A floating gate is insulated and spaced apart from at least a portion of the channel region. Charges are placed on the floating gate by a variety of mechanisms including but not limited to hot electron injection, Fowler-Nordheim tunneling, etc. Charges are removed from the floating gate to either a control gate, or either the first or second regions, or the channel itself. Such removal can occur by Fowler-Nordheim tunneling.

Typically, non-volatile memory floating gate cells have been of two types: stacked gate type or split gate type. In a split gate type, a floating gate is positioned over only a first portion of the channel region and controls the conduction of charges between the first region and the second region only in that first portion of the channel region. The control gate, which is separate and apart from the floating gate, controls the second portion of the channel region. To operate, the control gate must be "turned on" thereby permitting electron flow to occur in the channel region in the second portion. The state of charges accumulate on the floating gate control the conduction of the channel region in the first portion.

In a stacked gate non-volatile memory cell floating gate, the control gate is "stacked" on top of the floating gate. The floating gate is spaced apart and adjacent to the entire channel region and the state of charges retained on the floating gate control the conduction of the entire channel region.

A dynamically tunable resistor or capacitor is also well known in the art. Referring to FIG. 1 there is shown a dynamically tunable resistor 10 of the prior art. In the tunable resistor 10 of the prior art, a plurality of resistors ($R_0$-$R_6$) are connected in series. The resistor $R_0$ has one end connected to a voltage source $V_{CC}$ and another end connected to the output node $R_{out}$. The resistors $R_1$-$R_6$ are all connected in series to the node $R_{out}$. The other end of the series of resistors $R_1$-$R_6$ is connected to ground. Each of the resistors has one node connected to a switch $S_x$ which connects the resistor to ground thereby bypassing all of the other resistors. Thus, by selectively switching the switches $S_1$-$S_5$, various amounts of resistance can be placed in series with the resistor $R_0$ thereby altering the resistance at the node $R_{out}$.

A dynamically tunable capacitor 20 of the prior art is shown in FIG. 2. A capacitor $C_0$ is connected between $V_{CC}$ and ground. The node $C_{out}$ at $V_{CC}$ provides the output of the variable capacitor 20. The node $C_{out}$ is also connected to a plurality of capacitor $C_1$, $C_2$, $C_3$ and $C_4$. Each of the capacitors $C_1$-$C_4$ is connected through a switch $S_x$ in parallel between $V_{CC}$ and ground. Thus, the addition of each capacitor $C_x$ placed in parallel with capacitor $C_0$ changes the capacitance at $C_{out}$. By varying the switches $S_1$-$S_4$, different amounts of capacitance can be placed in parallel with the capacitor $C_0$ thereby altering the capacitance at the node $C_{out}$.

Although the variable resistor 10 and variable capacitor 20 of the prior art are satisfactory for their use, because these devices are made from integrated circuits, there are certain slowly degrading features of the integrated circuit that will cause them to drift away from originally designed optimized value for the resistance or capacitance. Although the circuit may still function, the quality may degrade from the optimized point during a prolonged period of use such as ten years of a life of a system. In addition, in particular applications such as radio frequency where the frequency of operation is high, such as 1 GHz-1000 GHz, such RF applications require very precisely tuned resistors and precisely tuned capacitors which do not vary or drift from originally designed values as the device is placed in operation. Thus, one object of the present invention is to provide a dynamically tunable, i.e. in situ variable resistor or variable capacitor that can be changed as the operation of the integrated circuit varies over the lifetime of its usage.

SUMMARY OF THE INVENTION

Therefore, in accordance with the present invention, a programmable resistor comprises a first resistor having a first end connectable to a first voltage source and a second end connected to a node. A non-volatile floating gate memory cell has a first and a second region in a semiconductor substrate with a channel there between. A floating gate is positioned adjacent to and spaced apart from at least a portion of the channel. The charges stored on the floating gate controls the resistance of the channel. The non-volatile floating gate memory cell further has a control gate. The first region is connected to the node and the second region is connectable to a second voltage source. A programming/erasing circuit is connected to the memory cell for changing the charges stored on the floating gate thereby changing the resistance of the channel. The node provides a desired resistance.

The present invention also is a programmable capacitor which comprises a first capacitor having a first end connected to a first node and a second end connected to a second node. A non-volatile floating gate memory cell has a first and a second region in a semiconductor substrate with a channel there between. A floating gate is positioned adjacent to and spaced apart from at least a portion of the channel. Charges stored on the floating gate controls the capacitance of the channel between the first and second regions. The memory cell further has a control gate. The first region is connected to the first end and the second region is connected to the second end. A programming/erasing circuit is connected to the memory cell for changing the charges stored on the floating gate thereby changing the capacitance between the first and second regions. The first end and second end provides a desired capacitance.

DETAILED DESCRIPTION OF THE INVENTION

Figure 1:
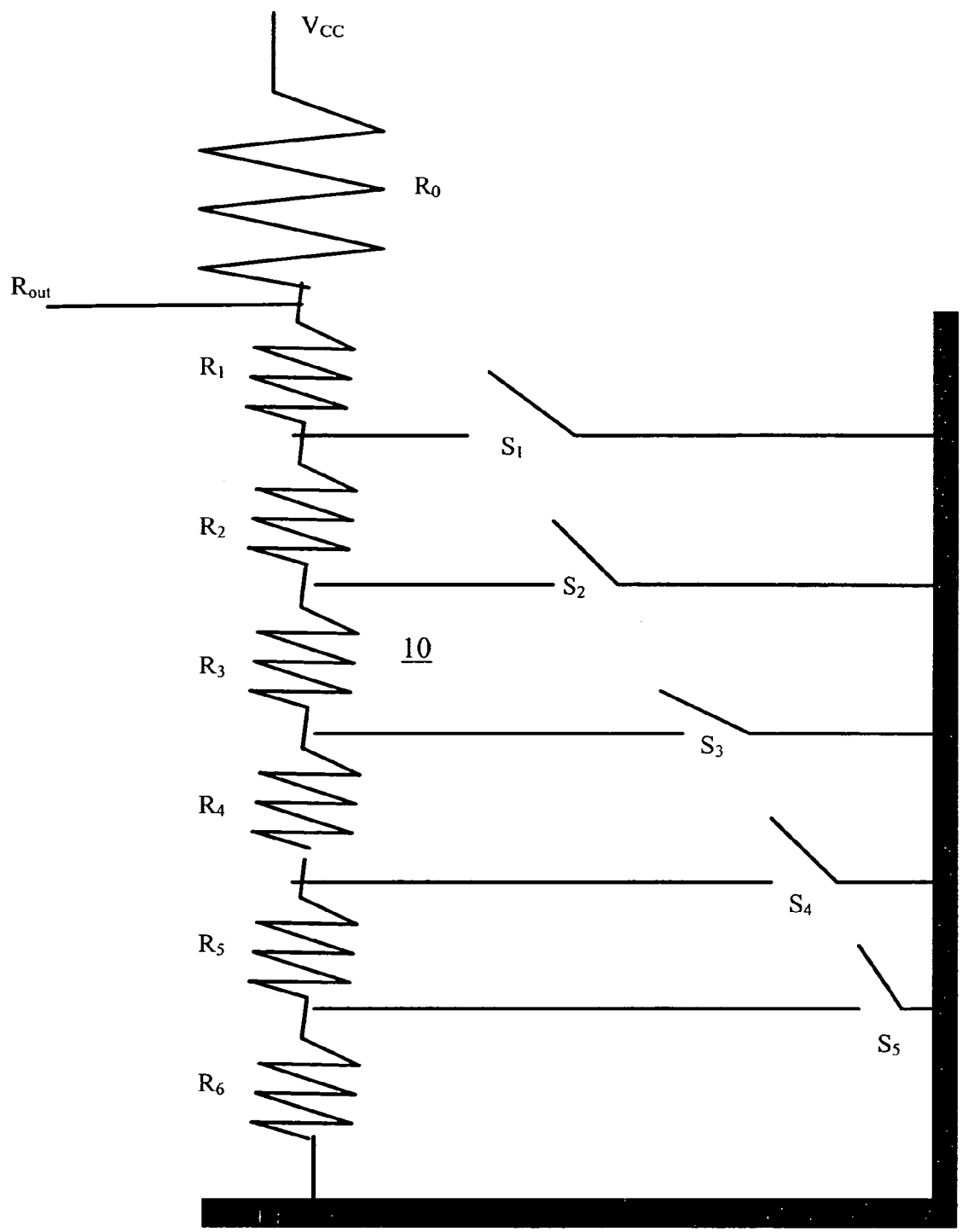
FIG. 1 is a circuit diagram of the tunable resistor of the prior art.
Figure 2:
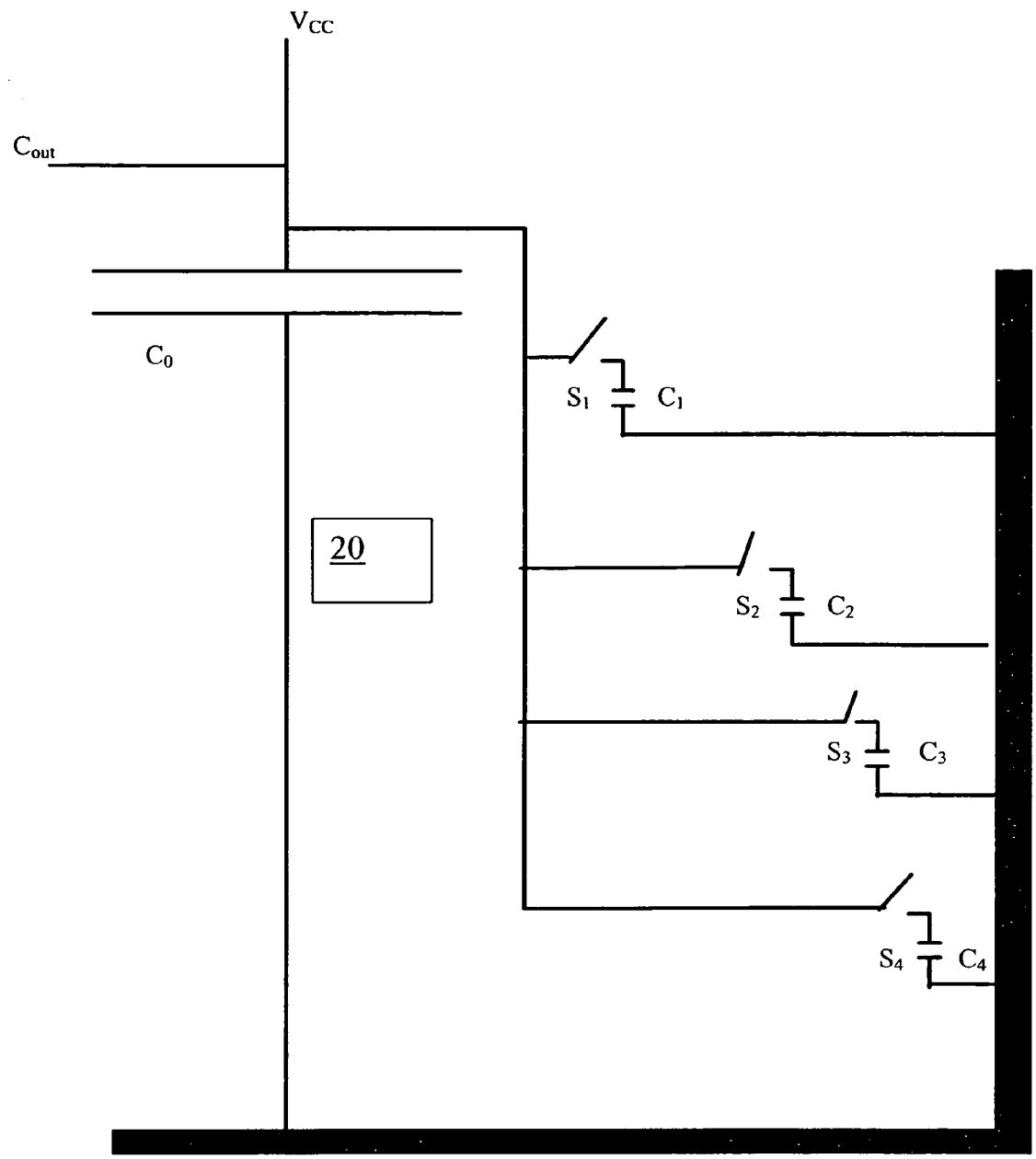
FIG. 2 is a circuit diagram of the tunable capacitor of the prior art.
Figure 3:
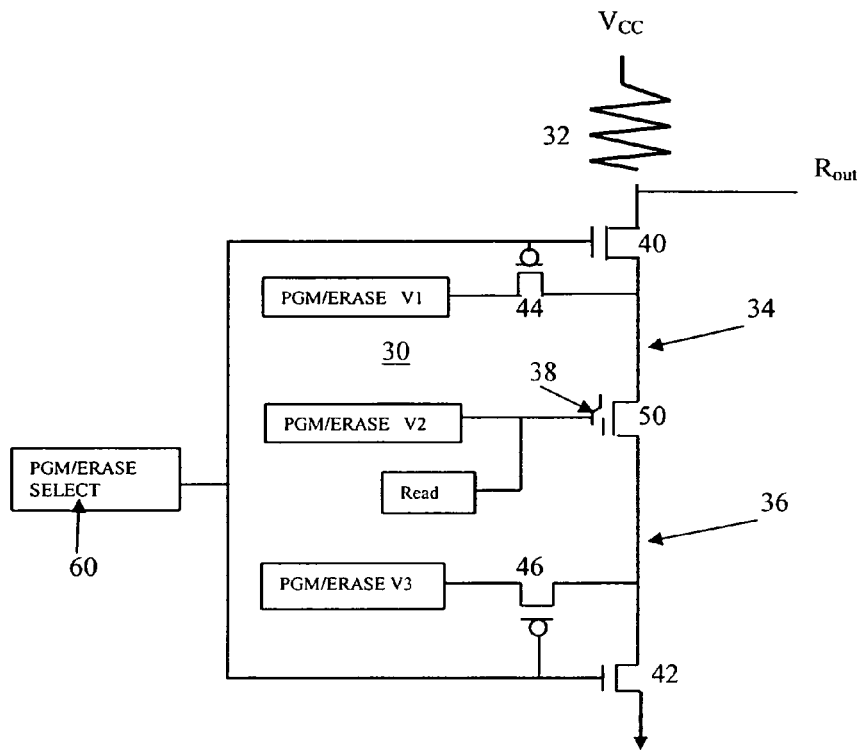
FIG. 3 is a circuit diagram of the programmable resistor of the present invention.

Referring to FIG. 3 there is shown a schematic diagram of a programmable resistor 30 of the present invention. The programmable resistor 30 comprises a first resistor 32 having a first end connected to a voltage source such as $V_{CC}$ and a second end connected to a node $R_{out}$. A non-volatile floating gate memory cell 50 has one end 34 connected to a NMOS switch 40 to the node $R_{out}$. The non-volatile floating gate memory cell 50 has a second end 36 connected through a second NMOS switch 42 to ground. Although in the preferred embodiment, the non-volatile floating gate memory cell 50 is of the split gate type and is of the construction and operation fully disclosed in U.S. Pat. No. 5,029,130 whose disclosure is incorporated herein in its entirety by reference, the non-volatile floating gate memory cell 50 need not be limited to that type. In particular, the non-volatile floating gate memory cell 50 can be any floating gate memory cell including stacked gate type or any other type of split gate.

Node 34 is also connected through a first PMOS switch 44 to a voltage source, PGM/Erase V1, for providing a voltage for the operation of the program and erase. The node 36 is also connected through a second PMOS switch 46 to a voltage source, PGM/Erase V3, which provides a voltage source for program and erase. Finally, as is disclosed in U.S. Pat. No. 5,029,130, the non-volatile floating gate memory cell 50 has a control gate 38 which is connected to a read voltage and to a voltage source PGM/Erase V2, which is activated during the operations of program or erase.

The first NMOS switch 40 and the first PMOS switch 44 are activated by a PGM/Erase select circuit 60. The PGM/Erase select circuit 60 also activates the second NMOS switch 42 and the second PMOS switch 46.

The operation of the programmable resistor 30 is as follows. Again, for illustration purposes only and not by way of any limitation, the operation is described with regard to the non-volatile floating gate memory cell 50 being of the type disclosed in U.S. Pat. No. 5,029,130. Assume that the non-volatile floating gate memory cell 50 is programmed to a certain level whereby electrons on the floating gate influences the resistance of the channel between the first node 34 and the second node 36. Thus, the connection between the first node 34 and the second node 36 through the non-volatile floating gate memory cell 50 acts as a resistor. Assume that the PGM/Erase select circuit 60 is activated so that the first and second PMOS switches 44 and 46 respectively are turned off and the first and second NMOS switches 40 and 42 are on. In that event, the resistance at the node $R_{out}$ is a function of a resistive divide circuit comprising of the resistor 32, the resistance through the first NMOS transistor 40, the resistance through the floating gate memory cell 50 (with a read voltage applied to the control gate 38), the resistance through the second NMOS switch 42, and the resistance through the wiring interconnecting all those elements. This resistance can be dynamically changed as follows.

When it is desired to increase the resistance through the floating gate memory cell 50, the floating gate of the memory cell 50 is further programmed by injecting electrons onto the floating gate rendering it more negatively charged. The increase in electrons or the negative charges on the floating gate would further restrict the current flow through the channel region between the first and second nodes 34 and 36 respectively, thereby increasing the resistance drop between the node 34 and 36. To program the floating gate memory cell 50, the PGM/Erase select circuit 60 is activated so that the first and second NMOS switches 40 and 42 are turned off. This isolates the floating gate memory cell 50 from the node $R_{out}$. In addition, the signal from the PGM/Erase select circuit 60 causes the first and second PMOS transistors 44 and 46 to be turned on connecting the first node 34 to the voltage from the PGM/Erase V1, and connecting the second node 36 to the voltage from the PGM/Erase V3. Finally, the control gate 38 is connected to the voltage from the PGM/Erase V2. As disclosed in U.S. Pat. No. 5,029,130, the voltage from the PGM/Erase V1 or the voltage at node 34 is held low or close to ground. The voltage from the PGM/Erase V2 applied to the control gate 38 is sufficiently high to turn on the channel region beneath the control gate 38. The voltage from the PGM/Erase V3 is raised to an elevated voltage such that electrons are accelerated to the node 36 through the channel between the first node 34 and the second node 36. Because the floating gate is highly capacitively coupled to the second node 36, the electrons will experience an abrupt voltage increase and be injected onto the floating gate. As can be seen, because the voltage at the first node 34 during programming is held at a relatively low voltage or close to ground, the first NMOS transistor switch 40 may not even be necessary to isolate the circuit from the node $R_{out}$. Therefore, the presence or existence of any of these first and second NMOS switches 40, and 42 and any of the PMOS switches 44 and 46 depends upon the program and erase operational characteristics of the floating gate memory cell 50 used.

To decrease the resistance across the first and second nodes 34 and 36 in the floating gate memory cell 50, it is first necessary to erase the floating gate memory cell 50. This can be done by applying an erase voltage through the first PMOS switch 44 to the first node 34, a second erase voltage to the control gate 38, and a third erase voltage through the second PMOS switch 46 to node 36. Again, using the floating gate memory cell 50 as disclosed in U.S. Pat. No. 5,029,130, the erase voltage V1 and V3 can be ground or close to ground or floating. The erase voltage V2 applied to the control gate 38 is sufficiently positive to cause Fowler-Nordheim tunneling of electrons from the floating gate to the control gate 38. Once the cell 50 is fully erased, it can then be programmed incrementally by injecting small amounts of electrons onto the floating gate thereby increasing the resistance between the first node 34 and the second node 36.

Figure 4:
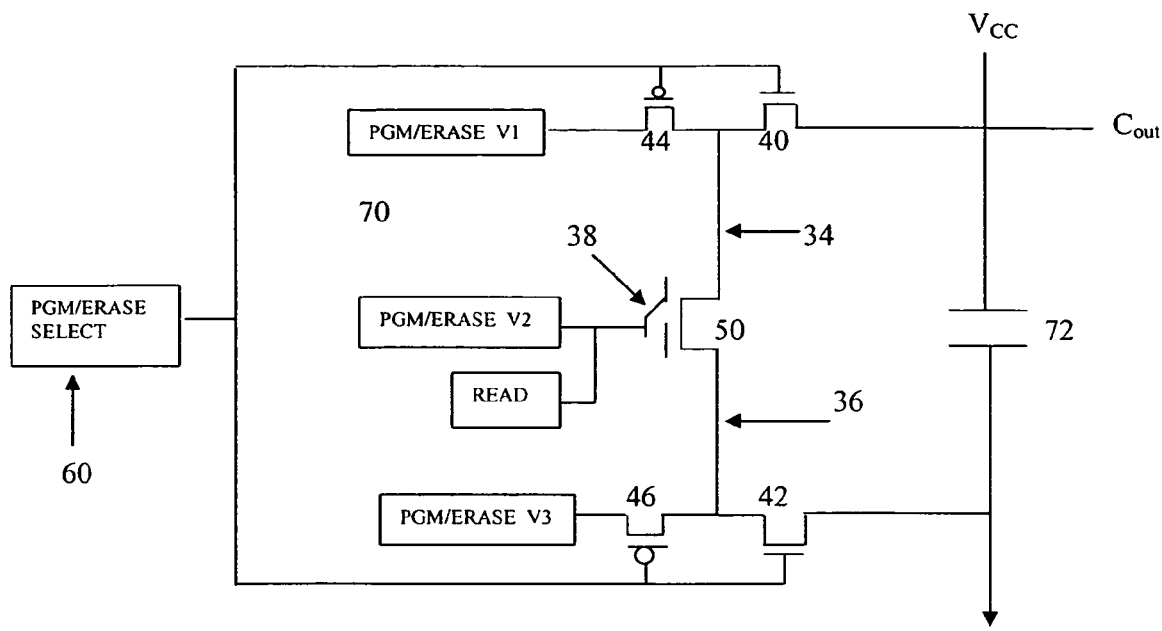
FIG. 4 is a circuit diagram of the programmable capacitor of the present invention.

Referring to FIG. 4 there is shown a programmable capacitor 70 of the present invention. The programmable capacitor 70 comprises a fixed capacitor 72 having two ends, a first end connected to the node $C_{out}$ and the second end connected to ground. The first end connected to $C_{out}$ is also connected to a voltage source such as $V_{CC}$. The programmable capacitor 70 also comprises a non-volatile floating gate memory cell 50 having first end 34 connected through a first NMOS switch 40 to the node $C_{out}$. The memory cell 50 has a second end 36 connected through a second NMOS switch 42 to ground. The first end 34 is also connected through a first PMOS switch 44 to a voltage source supplying PGM/Erase V1. The second end 36 is connected to a second PMOS transistor switch 46 to a voltage source PMG/Erase V3. The floating gate memory cell 50 has a control gate 38 connected to a voltage source PMG/Erase V2 and a read voltage source. The first NMOS switch 40 and the first PMOS transistor 44 are connected to the PGM/Erase select circuit 60 which is also connected to the second NMOS switch 42 and second PMOS switch 46.

In the operation of the programmable capacitor 70, first NMOS switch 40 and second NMOS switch 42 would be activated thereby connecting node 34 to $C_{out}$ and node 36 to ground. Thus, the floating gate memory cell 50 (with the read voltage applied to the control gate 38) is in parallel with the capacitor 72. A capacitance is established between the first node 34 and the second node 36 in the channel region there between with the capacitance of the channel region dictated by the amount of charge on the floating gate. Hence, a variable capacitor in the nature of the floating gate memory cell 50 is connected in parallel to the capacitor 72. In that event, the capacitance at the node $C_{out}$ would vary depending upon the capacitance of the floating gate memory cell 50 in parallel with $C_{out}$.

Similar to the description for the programmable resistor 30 shown in FIG. 3, if it is desired to decrease the capacitance of the floating gate memory cell 50 and thereby decreasing the capacitance of $C_{out}$, then the floating gate memory cell 50 is further programmed thereby injecting greater amounts of electrons onto the floating gate. This occurs by the PGM/Erase select circuit 60 turning off the first and second NMOS transistor switches 40 and 42 respectively and turning on the first and second PMOS transistor switches 44 and 46 respectively connecting the various program erase voltages to the nodes 34 and 36, all as described previously.

When it is desired to increase the capacitance at $C_{out}$, the capacitance of the floating gate memory cell 50 is increased. This can be done by first erasing the floating gate memory cell 50. Thereafter, the floating gate memory cell 50 is gradually programmed until the desired capacitance is reached.

Figure 5:
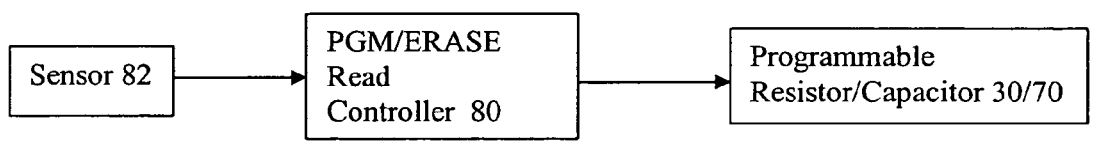
FIG. 5 is a block level diagram of one embodiment of a system using the programmable resistor or programmable capacitor of the present invention.

One application of the programmable resistor 30 or programmable capacitor 70 of the present invention can be seen by reference to FIG. 5. The device 30 or 70 is controlled by a program/erase read controller 80 which activates the various programming/erasing voltages, the read voltage, as well as the program/erase select circuit 60. The controller 80 is responsive to the output of a sensor 82. One application of the device of the present invention is if the sensor 82 were a temperature sensor affixed in situ in the same substrate as the programmable resistor 30 or programmable capacitor 70. The temperature sensor 82 would monitor the temperature of the integrated chip and can cause the controller 80 to change the resistance or the capacitance of the device as the operating temperature changes. In addition, of course, as the device operates and "degrades" over time, the capacitance or the resistance of the device can be fine tuned.

Figure 6:
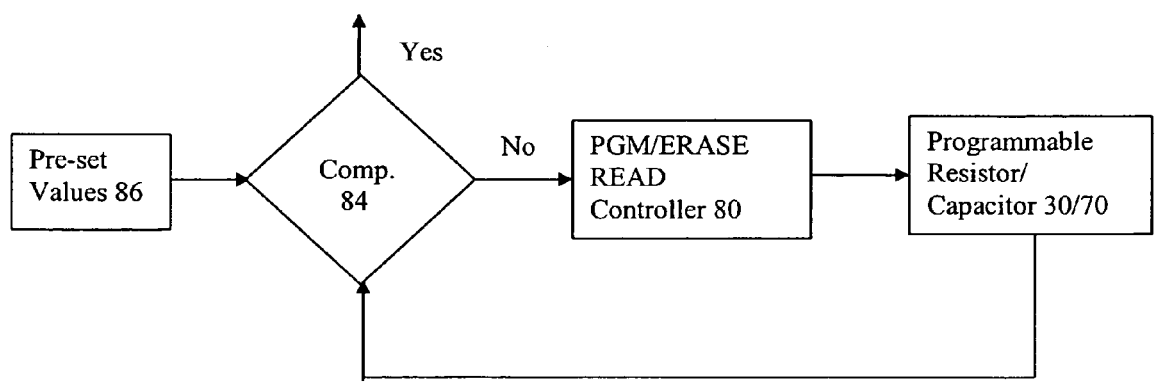
FIG. 6 is a block level diagram of another embodiment of a system using the programmable resistor or programmable capacitor of the present invention.

Referring to FIG. 6 there is shown a block level circuit diagram of another application of the programmable resistor 30 or programmable capacitor 70 of the present invention. Similar to the embodiment shown and described in FIG. 5, the device 30 or 70 is controlled by a program/erase read controller 80 which activates the various programming/erasing voltages, the read voltage, as well as the program/erase select circuit 60. The controller 80, however, is responsive to the output of a comparator 84. Upon each instance of power up, or system re-set or any other event, the "value" of the resistance in the resistor 30 or the capacitance in the capacitor 70 is read and is fed in a feed back manner to the comparator 84. The comparator 84 also receives as input therefore, the output from a memory or register 84 the pre-stored values of the resistance or capacitance. In the event, the resistance or the capacitance of the device 30/70 has deviated from the pre-stored values, the program/erase read controller 80 is activated to program or erase the device 30/70 such that the device 30/70 would have the pre-stored values. Such dynamic, real time, in-situ calibration can be performed during operation, as in the case of the presence of an electrically noisy environment, or upon each power up, or upon each system re-set, can optimize the performance of any system having the device 30/70.

What is claimed is:

1. A programmable resistor comprising:
   a first resistor having a first end connectable to a first voltage source, and a second end connected to a node;
   a non-volatile floating gate memory cell having a first and a second region in a semiconductor substrate with a channel therebetween, a floating gate positioned adjacent to and spaced apart from at least a portion of said channel, wherein charges stored on said floating gate for controlling the resistance of said channel, and a control gate;
   wherein said first region is connected to said node, and said second region is connectable to a second voltage source; and
   a programming/erasing circuit connected to said memory cell for changing the charges stored in said floating gate thereby changing the resistance of said channel;
   wherein said node provides a desired resistance.

2. The programmable resistor of claim 1 further comprising:
   a switch for isolating said memory cell from said node during a programming/erasing operation.

3. The programmable resistor of claim 1 wherein said programming/erasing circuit is responsive to the output of a sensor.

4. The programmable resistor of claim 3 wherein said sensor is a temperature sensor for measuring the temperature of said substrate.

5. The programmable resistor of claim 1, wherein said control gate is positioned adjacent to and spaced apart from said second region and another portion of said channel for controlling the resistance of said channel;
   wherein said floating gate is capacitively coupled to said first region;
   wherein said memory cell is programmed by electrons traversing from said second region to said first region and are injected onto the floating gate; and
   wherein said memory cell is erased by Fowler Nordheim tunneling of electrons from said floating gate to said control gate.

6. A programmable capacitor comprising:
   a first capacitor having a first end connected to a first node, and a second end connected to a second node;
   a non-volatile floating gate memory cell having a first and a second region in a semiconductor substrate with a channel therebetween, a floating gate positioned adjacent to and spaced apart from at least a portion of said channel, wherein charges stored on said floating gate for controlling the capacitance of said channel between said first and second regions, and a control gate;
   wherein said first region is connected to said first end and said second region is connected to said second end; and a programming/erasing circuit connected to said memory cell for changing the charges stored on said floating gate thereby changing the capacitance between said first and second regions;

wherein said first end and second end provides a desired capacitance.

7. The programmable capacitor of claim 6 further comprising:

a switch for isolating said memory cell from said first end and second end during a programming/erasing operation.

8. The programmable capacitor of claim 6 wherein said programming/erasing circuit is responsive to the output of a sensor.

9. The programmable capacitor of claim 8 wherein said sensor is a temperature sensor for measuring the temperature of said substrate.

10. The programmable capacitor of claim 1, wherein said control gate is positioned adjacent to and spaced apart from said second region and another portion of said channel for controlling the capacitance of said channel;

wherein said floating gate is capacitively coupled to said first region;

wherein said memory cell is programmed by electrons traversing from said second region to said first region and are injected onto the floating gate; and wherein said memory cell is erased by Fowler Nordheim tunneling of electrons from said floating gate to said control gate.

11. A programmable resistor/capacitor comprising:

a non-volatile floating gate memory cell having a first and a second region in a semiconductor substrate with a channel therebetween, a floating gate positioned adjacent to and spaced apart from at least a portion of said channel, wherein charges stored on said floating gate for controlling the resistance/capacitance of said channel between said first and second regions, and a control gate; said cell having a terminal for outputting the resistance/capacitance of said cell;

a programming/erasing/reading controller circuit connected to said control gate, and said first and second regions of said cell for controlling the operation of said cell;

a pre-set store for outputting a pre-set resistance/capacitance value; and a comparator for receiving as one input thereof the output from said terminal and for receiving as another input the output from said pre-set store and for comparing same; said comparator for activating said programming/erasing/reading controller circuit to change the amount of charges stored on said floating gate to change said resistance/capacitance of said cell in the event said output from said terminal differs from said output from said pre-set store.

12. The programmable resistor/capacitor of claim 11 wherein said comparator is activated upon power up.

13. The programmable resistor/capacitor of claim 11 wherein said comparator is activated upon system re-set.

14. The programmable resistor/capacitor of claim 11 wherein said comparator is activated upon an interrupt.

15. The programmable resistor/capacitor of claim 11 wherein said programmable resistor/capacitor is a programmable capacitor further comprising:

a first capacitor having a first end connected to a first node, and a second end connected to a second node;

said first region of said memory cell connected to said first end, and said second region of said memory cell is connected to said second end;

wherein said first end and second end provides a desired capacitance.

16. The programmable capacitor of claim 15 further comprising:

a switch for isolating said memory cell from said first end and second end during a programming/erasing operation.

17. The programmable resistor/capacitor of claim 11 wherein said programmable resistor/capacitor is a programmable resistor further comprising:

a first resistor having a first end connectable to a first voltage source, and a second end connected to a node;

said first region of said cell is connected to said node, and said second region of said cell is connectable to a second voltage source; and wherein said node provides a desired resistance.

18. The programmable resistor of claim 17 further comprising:

a switch for isolating said memory cell from said node during a programming/erasing operation.

* * * * *